United States Patent
Kalima et al.

(10) Patent No.: US 10,315,371 B2
(45) Date of Patent: Jun. 11, 2019

(54) MULTIPHASE OPTICAL GRATING

(71) Applicant: Microsoft Technology Licensing, LLC, Redmond, WA (US)

(72) Inventors: Valtteri Kalima, Porvoo (FI); Mervi Ylä-Jarkko, Hämeenlinna (FI); Juha Pietarinen, Espoo (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 304 days.

(21) Appl. No.: 15/233,783

(22) Filed: Aug. 10, 2016

(65) Prior Publication Data

US 2018/0029319 A1    Feb. 1, 2018

Related U.S. Application Data

(60) Provisional application No. 62/368,090, filed on Jul. 28, 2016.

(51) Int. Cl.
  *B29D 11/00* (2006.01)
  *B29C 41/22* (2006.01)
  (Continued)

(52) U.S. Cl.
  CPC ........ *B29D 11/00769* (2013.01); *B29C 41/22* (2013.01); *G02B 5/1857* (2013.01);
  (Continued)

(58) Field of Classification Search
  CPC . B29D 11/00769; B29C 41/22; G03F 7/0002; G02B 5/1857; G02B 6/00
  See application file for complete search history.

(56) References Cited

U.S. PATENT DOCUMENTS 7,656,585 B1   2/2010 Powell et al.
8,514,391 B2   8/2013 Wawro et al.
(Continued)

FOREIGN PATENT DOCUMENTS

WO   2011042608 A1   4/2011
WO   2014053706 A1   4/2014

OTHER PUBLICATIONS

Byeon, et al., "Recent Progress in Direct Patterning Technologies Based on Nano-Imprint Lithography", In Proceedings of the European Physical Journal Applied Physics, vol. 59, Issue 1, Jul. 2012, 21 pages.
(Continued)

*Primary Examiner* — Mathieu D Vargot
(74) *Attorney, Agent, or Firm* — Arent Fox LLP

(57) ABSTRACT

Methods for improving the manufacturing of optical gratings and surface relief grating structures are described. An optical grating may be formed by spin coating a liquid monomer solution that includes a solvent, a liquid monomer, and a nanoparticle filler with a higher refractive index than the liquid monomer on a substrate. The optical grating may be formed by pressing a mold that includes nanostructures on its surface into the liquid monomer to form gratings and then hardening the liquid monomer while the mold is held within the liquid monomer. After the mold has been pressed into the liquid monomer, two regions within the liquid monomer may be formed: a first region that includes the gratings and that does not include nanoparticles (or that includes less than a threshold number of nanoparticles) and a second region arranged below the gratings that includes nanoparticles.

20 Claims, 8 Drawing Sheets

(51) Int. Cl.
G03F 7/00 (2006.01)
G02B 5/18 (2006.01)
G02B 6/00 (2006.01)
F21V 8/00 (2006.01)
G02B 27/01 (2006.01)

(52) U.S. Cl.
CPC .............. G02B 6/00 (2013.01); G03F 7/0002 (2013.01); *G02B 6/0016* (2013.01); *G02B 27/0172* (2013.01)

(56) References Cited

U.S. PATENT DOCUMENTS

| | | |
|---|---|---|
| 8,625,941 B1 | 1/2014 | Shi et al. |
| 8,824,842 B2 | 9/2014 | Matsumoto |
| 2003/0039443 A1 | 2/2003 | Catchmark et al. |
| 2010/0246008 A1 | 9/2010 | Murata et al. |
| 2011/0214600 A1 | 9/2011 | Hurme et al. |
| 2011/0273775 A1 | 11/2011 | Sasaki et al. |
| 2012/0120494 A1* | 5/2012 | Takayama ............ G02B 5/1823 359/576 |
| 2013/0100656 A1 | 4/2013 | Kalima |
| 2014/0140654 A1 | 5/2014 | Brown et al. |
| 2015/0231841 A1* | 8/2015 | Tearney ........... B29D 11/00663 156/247 |
| 2016/0283618 A1* | 9/2016 | Levola ................ G06F 17/5009 |

OTHER PUBLICATIONS

Song, et al., "Elastomeric Polymer Resonant Waveguide Grating based Pressure Sensor", In Journal of Optics, vol. 16, Issue 6, Jun. 2014, pp. 1-13.

Khaleque, et al., "Fabrication of resonant Patterns Using Thermal Nano-Imprint Lithography for Thin-Film Photovoltaic Applications", In Journal of Optics Express, vol. 21, Issue S4, May 23, 2013, 11 pages.

"Design of Diffraction Gratings", Published on: Jan. 24, 2013 Available at: http://spie.org/samples/TT62.pdf.

Chen, et al., "On-Chip Optical Mode Conversion Based on Dynamic Grating in Photonic-Phononic Hybrid Waveguide", In Journal of Scientific Reports, vol. 5, May 21, 2015, pp. 1-7.

Diéguez, et al., "Optical Gratings Coated with Thin Si3N4 Layer for Efficient Immunosensing by Optical Waveguide Lightmode Spectroscopy", In Journal of Biosensors, vol. 2, issue 2, Apr. 10, 2012, pp. 115-126.

"International Search Report and Written Opinion Issued in PCT Application No. PCT/US2017/042954", dated Oct. 23, 2017, 12 Pages.

* cited by examiner

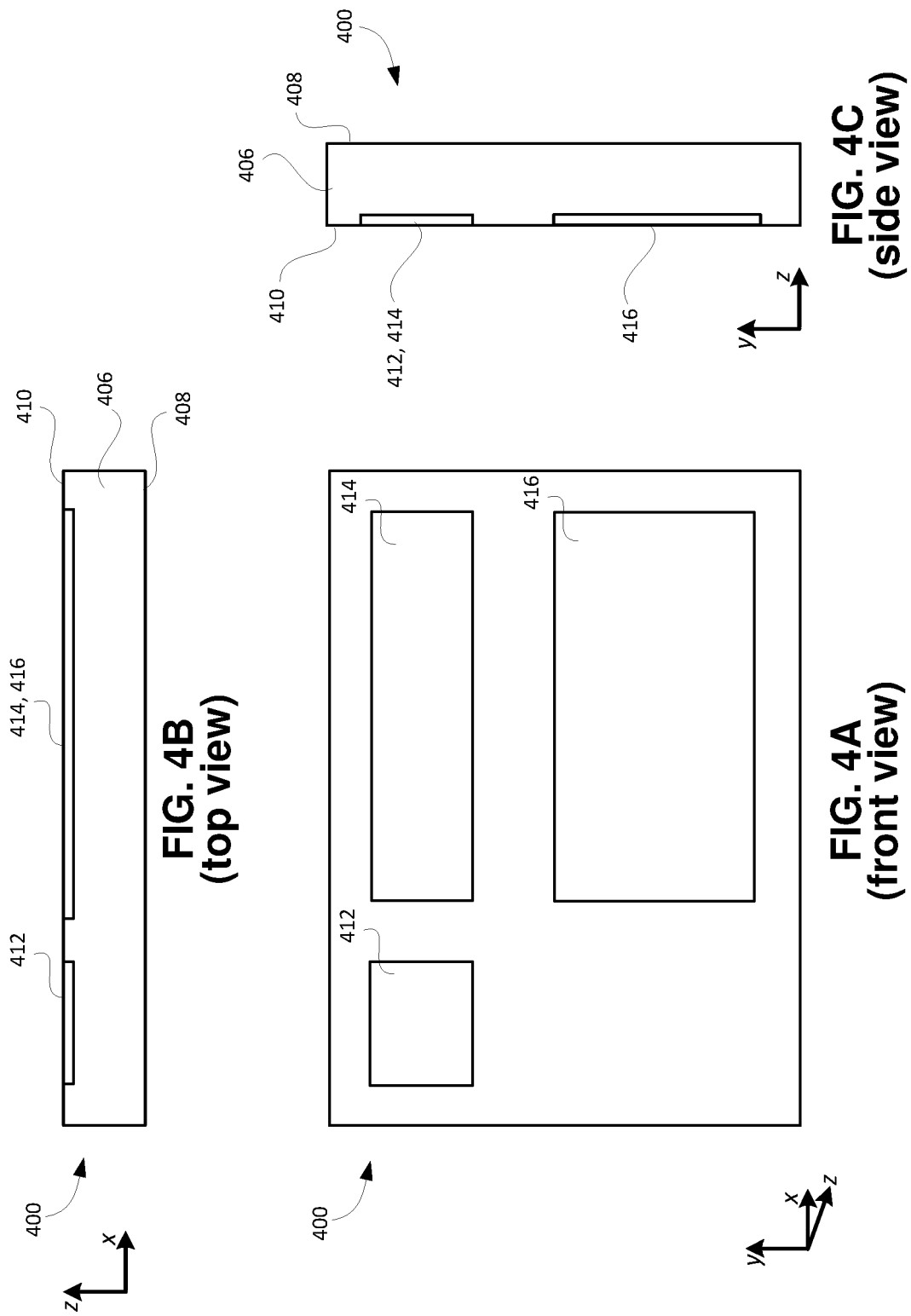

US 10,315,371 B2

MULTIPHASE OPTICAL GRATING

CLAIM OF PRIORITY

The present application claims priority to U.S. Provisional Application No. 62/368,090, entitled "Multiphase Optical Grating," filed Jul. 28, 2016, which is herein incorporated by reference in its entirety.

BACKGROUND

Augmented reality (AR) relates to providing an augmented real-world environment where the perception of a real-world environment (or data representing a real-world environment) is augmented or modified with computer-generated virtual data. For example, data representing a real-world environment may be captured in real-time using sensory input devices such as a camera or microphone and augmented with computer-generated virtual data including virtual images and virtual sounds. The virtual data may also include information related to the real-world environment such as a text description associated with a real-world object in the real-world environment. The objects within an AR environment may include real objects (i.e., objects that exist within a particular real-world environment) and virtual objects (i.e., objects that do not exist within the particular real-world environment).

SUMMARY

Optical gratings and surface relief grating structures may be used in various see-through display devices, such as near eye display devices, for providing waveguide input and output coupling. In some cases, an optical grating may be formed by pouring or spin coating a liquid monomer solution that includes a solvent, a liquid monomer, and a nanoparticle filler with a higher refractive index than the liquid monomer on a substrate (e.g., the substrate may comprise a portion of a glass waveguide used in a see-through display). After the liquid monomer solution has been applied to the surface of the substrate, the solvent may be removed (e.g., baked away) leaving the liquid monomer with the nanoparticle filler uniformly distributed within the liquid monomer remaining on the surface of the substrate. The optical grating may then be formed by pressing a mold that includes nanostructures on its surface into the liquid monomer to form the optical grating and then solidifying the liquid monomer (e.g., using heat or UV light) while the mold is held within the liquid monomer. In some cases, after the mold has been pressed into the liquid monomer, two regions within the liquid monomer may be formed: a first region that includes the optical grating and that does not include nanoparticles (or that includes less than a threshold number of nanoparticles) and a second region that does not include the optical grating (e.g., a bias layer) that includes nanoparticles (or that includes more than the threshold number of nanoparticles). In other cases, the phase separation of the liquid monomer into a first region that includes the optical grating and that does not include nanoparticles (or that includes less than a threshold number of nanoparticles) and a second region that does not include the optical grating that includes nanoparticles (or that includes more than the threshold number of nanoparticle may at least partially occur during the application of the liquid monomer to the surface of the substrate or during removal of the solvent (e.g., during hot baking to evaporate away the solvent).

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 4A-4C depict various embodiment of a portion of a see-through display.

DETAILED DESCRIPTION

Figure 1:
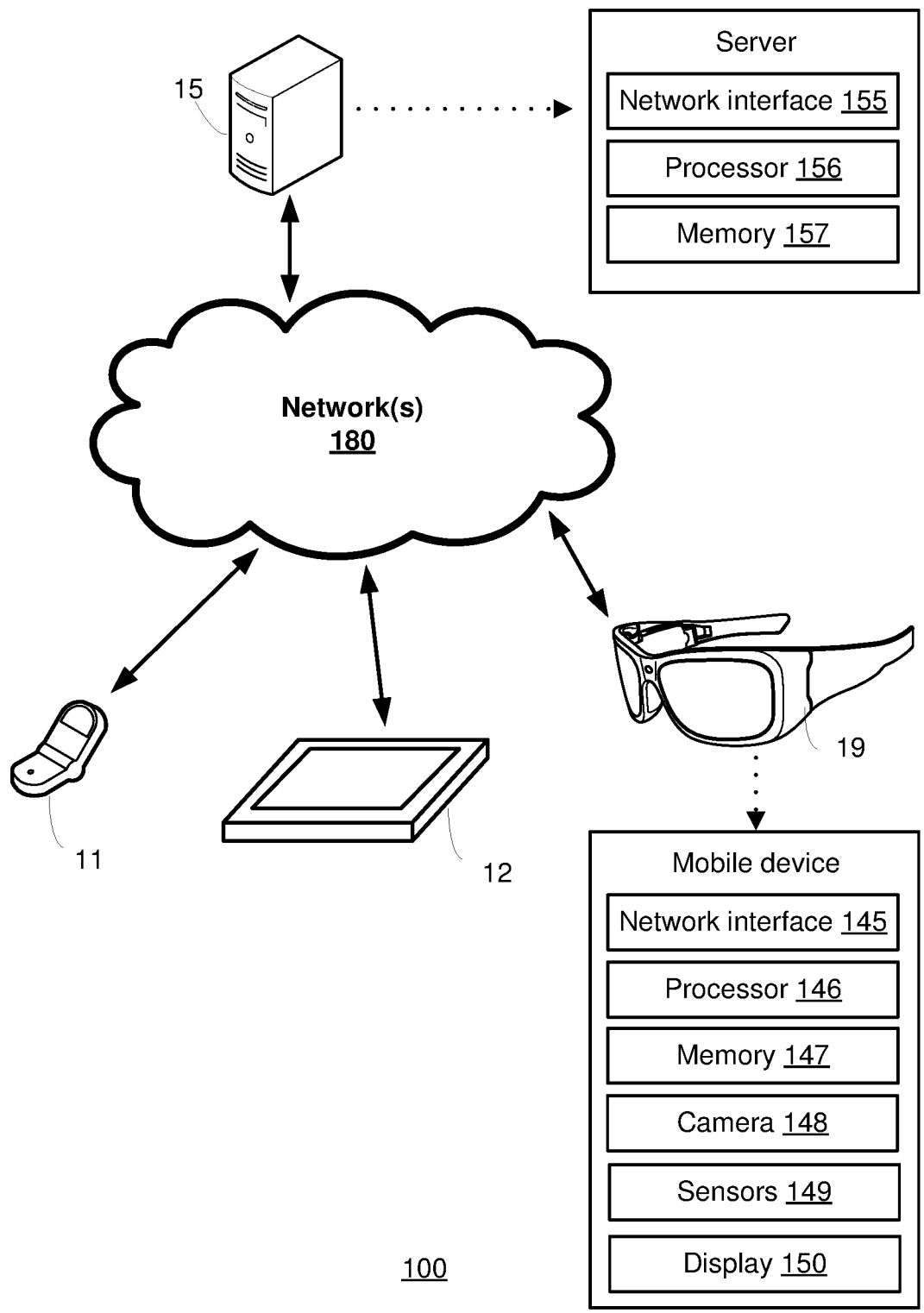
FIG. 1 is a block diagram of one embodiment of a networked computing environment in which the disclosed technology may be practiced.

Technology is described for improving the optical functions of optical gratings and improving the manufacturing of optical gratings and surface relief grating structures. The optical gratings and surface relief grating structures may be used for providing waveguide input and output coupling and for providing light distribution management in a waveguide. An optical grating may be part of a display device, such as a head-mounted display device (HMD) or a near eye display device (NED), that includes a display for displaying virtual objects within an augmented reality environment. The optical grating may be fabricated using lithography, imprinting, and molding techniques. In some embodiments, an optical grating may be formed by pouring or spin coating a liquid monomer solution that includes a solvent, a liquid monomer, and a nanoparticle filler with a higher refractive index than the liquid monomer on a substrate (e.g., a glass or plastic substrate). After the liquid monomer solution has been applied to the surface of the substrate, the solvent may be baked away leaving the liquid monomer with the nanoparticle filler remaining on the surface. The optical grating may be formed by pressing a mold that includes nanostructures on its surface into the liquid monomer to form gratings (e.g., replicating the grating structure formed by the nanostructures) and then hardening or solidifying the liquid monomer (e.g., using heat or UV light) while the mold is held within the liquid monomer. The substrate may comprise a portion of a waveguide (e.g., a glass waveguide). The mold may comprise a UV transparent mold and may comprise glass, silicon, or a transparent polymer. The mold may comprise a non-transparent mold. The liquid monomer may comprise a UV curable liquid monomer or a transparent liquid plastic and the nanoparticles may be evenly distributed within the liquid monomer prior to application of the liquid monomer to the surface of the substrate. The nanoparticles may comprise zirconium dioxide, silicon dioxide, and/or titanium dioxide nanoparticles.

After the mold has been pressed into the liquid monomer, two regions within the liquid monomer may be formed: a first region that includes the gratings and that does not include nanoparticles (or that includes less than a threshold number of nanoparticles) and a second region arranged below the gratings that includes nanoparticles (or that includes more than the threshold number of nanoparticles). In some cases, the separation of the evenly distributed nanoparticles within the liquid monomer may occur while the mold is pressed into the liquid monomer. The first region may have a first refractive index (e.g., between 1.35 and 1.45 or between 1.5 and 1.7) and the second region may have a second refractive index different from the first refractive index (e.g., between 1.6 and 1.5 or between 1.9 and 2.1). In some cases, the second refractive index may be greater than the first refractive index. In other cases, the second refractive index may be less than the first refractive index. The refractive index (or index of refraction) of a material may refer to a dimensionless number that describes how light propagates through that material. The refractive index of a material may comprise the ratio of the speed of light in a vacuum to the phase velocity of light in the material. The second region may abut or directly overlay the substrate and may have a refractive index that is substantially the same as that of the substrate (e.g., a refractive index of 1.5 or between 1.55 and 1.45). The first region may abut or directly overlay the second region and may have a refractive index that is less than that of the second region (e.g., a refractive index of 1.3 or between 1.25 and 1.35). Benefits of creating the two different regions with different refractive indices using a phase separating material is that a subsequent etching step to remove portions of the second region (e.g., the bias layer) need not be performed and the thickness of the bias layer may not need to be reduced after the grating has been formed within the first region.

In some embodiments, a high refractive index resin whose composition is designed to form separated regions with different refractive indices after application of a mold may be arranged over a waveguide material (e.g., glass). After the mold has been pressed into the resin, an optical grating region (e.g., a first region) may be formed whose refractive index matches (or is substantially the same as) a particular optical grating profile and a bias layer region (e.g., a second region) may be formed whose refractive index matches that of the waveguide material. The resin may include one or more liquid monomer compounds and an inorganic nano-filler with a higher refractive index than the one or more liquid monomer compounds. In one example, the refractive index of the nanofiller may be around 2 (e.g., between 1.95 and 2.05) and the refractive index of the waveguide or base material may be around 1.6 (e.g., between 1.5 and 1.7). In some cases, the resin may include one or more liquid monomer compounds and an organic nanofiller with a higher refractive index than the one or more liquid monomer compounds. The resin may include one or more liquid monomer compounds and an organic-inorganic nanofiller or an organic-inorganic hybrid dye or dopant.

In some cases, the two regions within the liquid monomer may be formed by pressing the mold into a first portion of the liquid monomer at a first rate and then pressing the mold into a second portion of the liquid monomer below the first portion at a second rate different from the first rate. The first rate may be greater than the second rate. In some cases, the two regions within the liquid monomer may be formed by pressing the mold into a first portion of the liquid monomer without applying heat or UV light to the liquid monomer and then pressing the mold into a second portion of the liquid monomer below the first portion while applying heat or UV light to the liquid monomer. In some cases, the two regions within the liquid monomer may be formed by pressing the mold into a first portion of the liquid monomer while the liquid monomer is set to a first temperature and then pressing the mold into a second portion of the liquid monomer below the first portion while the liquid monomer is set to a second temperature different from the first temperature. The second temperature may be greater than the first temperature. In some cases, the two regions within the liquid monomer may be formed by pressing the mold into a first portion of the liquid monomer while the liquid monomer is exposed to UV light of a first light intensity and then pressing the mold into a second portion of the liquid monomer below the first portion while the liquid monomer is exposed to UV light of a second light intensity different from the first light intensity. The second light intensity may be greater than the first light intensity.

FIG. 1 is a block diagram of one embodiment of a networked computing environment 100 in which the disclosed technology may be practiced. Networked computing environment 100 includes a plurality of computing devices interconnected through one or more networks 180. The one or more networks 180 allow a particular computing device to connect to and communicate with another computing device. The depicted computing devices include mobile device 11, mobile device 12, mobile device 19, and server 15. In some embodiments, the plurality of computing devices may include other computing devices not shown. In some embodiments, the plurality of computing devices may include more than or less than the number of computing devices shown in FIG. 1. The one or more networks 180 may include a secure network such as an enterprise private network, an unsecure network such as a wireless open network, a local area network (LAN), a wide area network (WAN), and the Internet. Each network of the one or more networks 180 may include hubs, bridges, routers, switches, and wired transmission media such as a wired network or direct-wired connection.

Server 15, which may comprise a supplemental information server or an application server, may allow a client to download information (e.g., text, audio, image, and video files) from the server or to perform a search query related to particular information stored on the server. In general, a "server" may include a hardware device that acts as the host in a client-server relationship or a software process that shares a resource with or performs work for one or more clients. Communication between computing devices in a client-server relationship may be initiated by a client sending a request to the server asking for access to a particular resource or for particular work to be performed. The server may subsequently perform the actions requested and send a response back to the client.

One embodiment of server 15 includes a network interface 155, processor 156, and memory 157, all in communication with each other. Network interface 155 allows server 15 to connect to one or more networks 180. Network interface 155 may include a wireless network interface, a modem, and/or a wired network interface. Processor 156 allows server 15 to execute computer readable instructions stored in memory 157 in order to perform processes discussed herein.

One embodiment of mobile device 19 includes a network interface 145, processor 146, memory 147, camera 148, sensors 149, and display 150, all in communication with each other. Network interface 145 allows mobile device 19 to connect to one or more networks 180. Network interface 145 may include a wireless network interface, a modem, and/or a wired network interface. Processor 146 allows mobile device 19 to execute computer readable instructions stored in memory 147 in order to perform processes discussed herein. Camera 148 may capture color images and/or depth images of an environment. The mobile device 19 may include outward facing cameras that capture images of the environment and inward facing cameras that capture images of the end user of the mobile device. Sensors 149 may generate motion and/or orientation information associated with mobile device 19. In some cases, sensors 149 may comprise an inertial measurement unit (IMU). Display 150 may display digital images and/or videos. Display 150 may comprise a see-through display.

In some embodiments, various components of mobile device 19 including the network interface 145, processor 146, memory 147, camera 148, and sensors 149 may be integrated on a single chip substrate. In one example, the network interface 145, processor 146, memory 147, camera 148, and sensors 149 may be integrated as a system on a chip (SOC). In other embodiments, the network interface 145, processor 146, memory 147, camera 148, and sensors 149 may be integrated within a single package.

In some embodiments, mobile device 19 may provide a natural user interface (NUI) by employing camera 148, sensors 149, and gesture recognition software running on processor 146. With a natural user interface, a person's body parts and movements may be detected, interpreted, and used to control various aspects of a computing application. In one example, a computing device utilizing a natural user interface may detect that a person has performed a particular gesture in order to control the computing device.

Networked computing environment 100 may provide a cloud computing environment for one or more computing devices. Cloud computing refers to Internet-based computing, wherein shared resources, software, and/or information are provided to one or more computing devices on-demand via the Internet (or other global network). The term "cloud" may be used as a metaphor for the Internet, based on the cloud drawings used in computer networking diagrams to depict the Internet as an abstraction of the underlying infrastructure it represents.

In one example, mobile device 19 comprises a head-mounted display device (HMD) that provides an augmented reality environment or a mixed reality environment to an end user of the HMD. The HMD may comprise a video see-through and/or an optical see-through system. An optical see-through HMD worn by an end user may allow actual direct viewing of a real-world environment (e.g., via transparent lenses) and may, at the same time, project images of a virtual object into the visual field of the end user thereby augmenting the real-world environment perceived by the end user with the virtual object.

Utilizing an HMD, an end user may move around a real-world environment (e.g., a living room or a furniture store) wearing the HMD and perceive views of the real-world overlaid with images of virtual objects. The virtual objects may appear to maintain coherent spatial relationship with the real-world environment (i.e., as the end user turns their head or moves within the real-world environment, the images displayed to the end user may change such that the virtual objects appear to exist within the real-world environment as perceived by the end user). The virtual objects may also appear fixed with respect to the end user's point of view (e.g., a virtual menu that always appears in the top right corner of the end user's point of view regardless of how the end user turns their head or moves within the real-world environment). In one embodiment, environmental mapping of the real-world environment may be performed by server 15 (i.e., on the server side) while camera localization may be performed on mobile device 19 (i.e., on the client side).

Figure 2A:
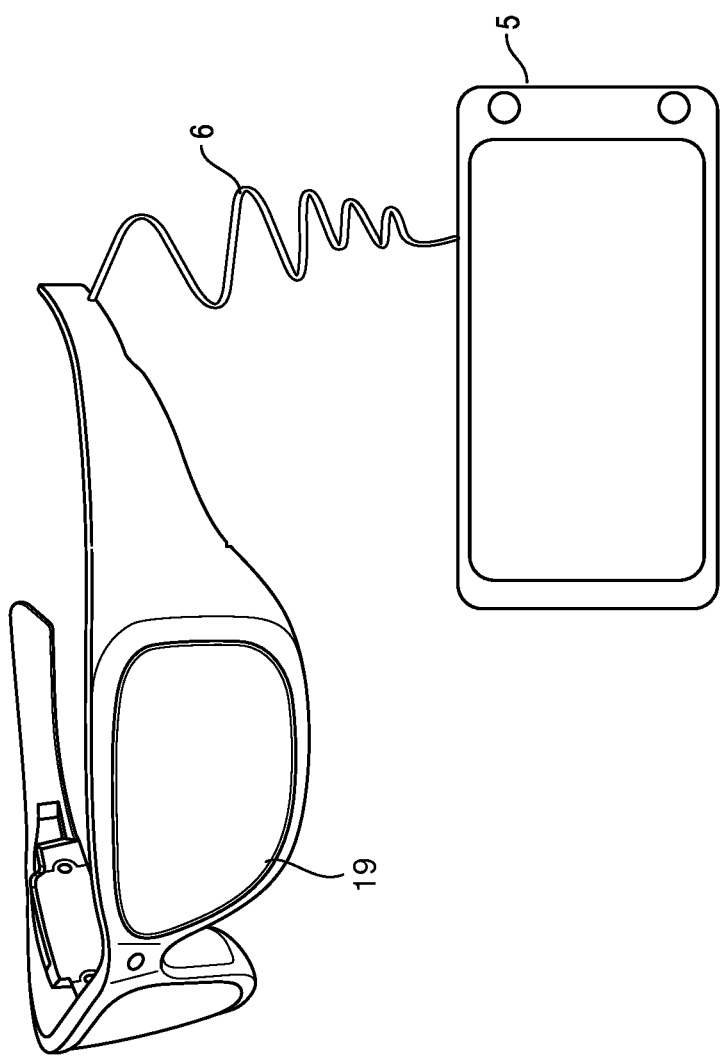
FIG. 2A depicts one embodiment of a mobile device in communication with a second mobile device.

FIG. 2A depicts one embodiment of a mobile device 19 in communication with a second mobile device 5. Mobile device 19 may comprise a see-through HMD. As depicted, mobile device 19 communicates with mobile device 5 via a wired connection 6. However, the mobile device 19 may also communicate with mobile device 5 via a wireless connection. Mobile device 5 may be used by mobile device 19 in order to offload compute intensive processing tasks (e.g., the rendering of virtual objects) and to store virtual object information and other data that may be used to provide an augmented reality environment on mobile device 19. Mobile device 5 may also provide motion and/or orientation information associated with mobile device 5 to mobile device 19. In one example, the motion information may include a velocity or acceleration associated with the mobile device 5 and the orientation information may include Euler angles, which provide rotational information around a particular coordinate system or frame of reference. In some cases, mobile device 5 may include a motion and orientation sensor, such as an inertial measurement unit (IMU), in order to acquire motion and/or orientation information associated with mobile device 5. The IMU may include a tri-axial accelerometer, a tri-axial gyro, and a tri-axial magnetic sensor. The mobile device 5 may determine an inertial frame using the IMU. The inertial reference frame may include an x-axis pointing North, a y-axis pointing East, and a z-axis pointing down towards the Earth.

In one embodiment, a mobile device, such as mobile device 5, may be positioned such that an orientation of the mobile device is held fixed (or substantially fixed) relative to the body of an end user of the mobile device. In one example, the mobile device may be positioned within a back pocket of pants or shorts worn by the end user. In another example, the mobile device may be positioned within a front pocket of a shirt or jacket worn by the end user. In another example, the mobile device may be strapped or clipped to a belt worn around the end user's waist. In these cases, an orientation of the mobile device relative to the end user's body may be determined using accelerometer and magnetometer data generated by the mobile device. The mobile device may generate a gravity vector or a vector that is orthogonal to a surface of the Earth based on the accelerometer and magnetometer data. The gravity vector may correspond with a vector that points towards the ground from a point on the mobile device. In one embodiment, an axis of a virtual cylinder may correspond with the gravity vector. The axis may correspond with a line that intersects the mobile device and is parallel to the gravity vector. The mobile device may also generate a North vector or a vector that is orthogonal to the gravity vector and points in a northern direction based on the accelerometer and magnetometer data. In some cases, during a calibration step, the mobile device may determine a front facing vector by asking the end user to face North and align the front of their body with the North vector. The front facing vector may then move relative to a North-East-Down (NED) reference frame generated by the mobile device.

Figure 2B:
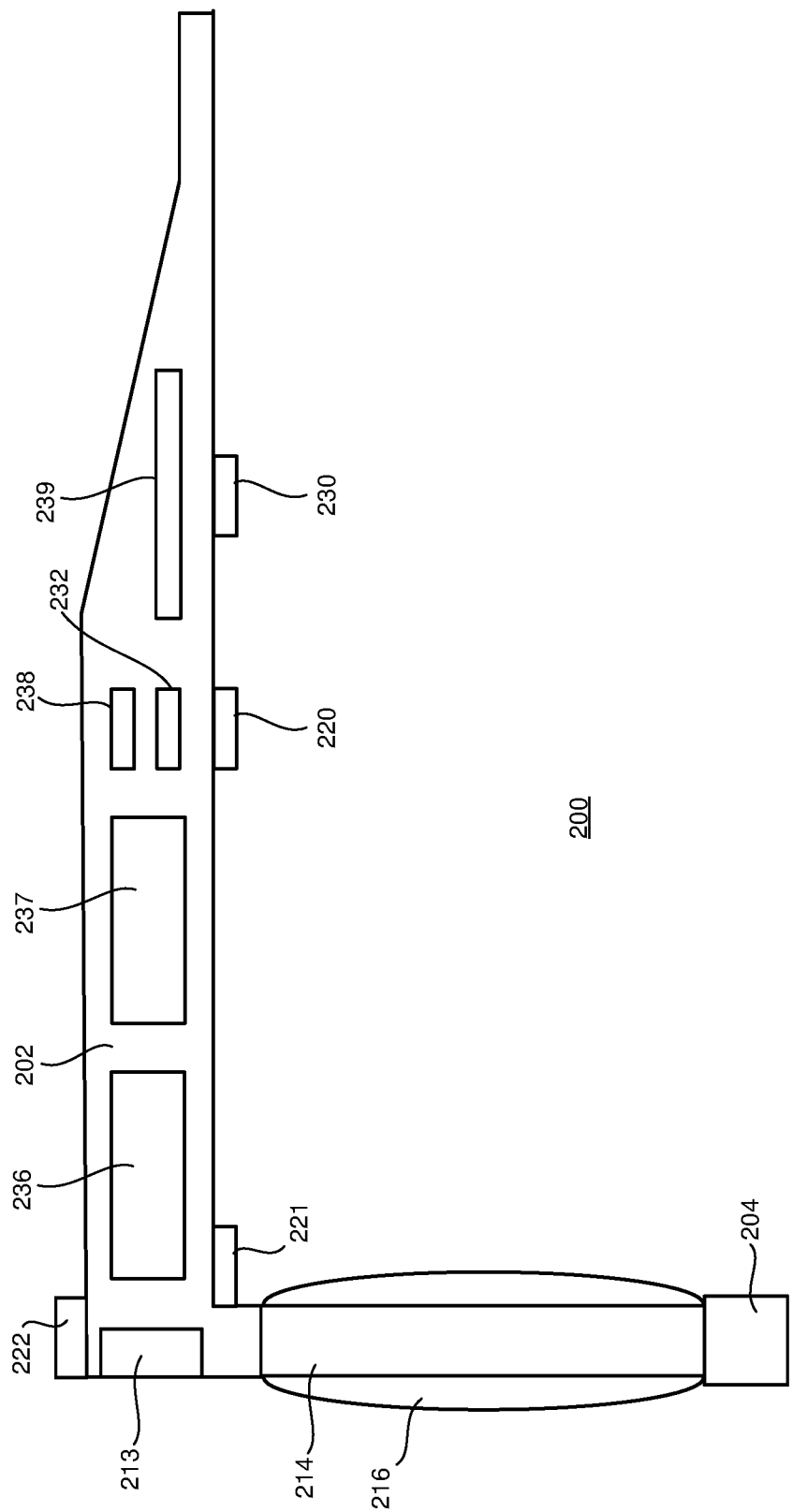
FIG. 2B depicts one embodiment of a portion of an HMD.

FIG. 2B depicts one embodiment of a portion of an HMD, such as mobile device 19 in FIG. 1. Only the right side of an HMD 200 is depicted. HMD 200 includes right temple 202, nose bridge 204, eye glass 216, and eye glass frame 214. The eye glass 216 may comprise part of a see-through display, such as display 150 in FIG. 1. The see-through display may include a waveguide not shown. Right temple 202 includes a capture device 213 (e.g., a front facing camera and/or microphone) in communication with processing unit 236. The capture device 213 may include one or more cameras for recording digital images and/or videos and may transmit the visual recordings to processing unit 236. The one or more cameras may capture color information, IR information, and/or depth information. The capture device 213 may also include one or more microphones for recording sounds and may transmit the audio recordings to processing unit 236.

Right temple 202 also includes biometric sensor 220, eye tracking system 221, body facing camera 222, ear phones 230, motion and orientation sensor 238, GPS receiver 232, power supply 239, and wireless interface 237, all in communication with processing unit 236. Biometric sensor 220 may include one or more electrodes for determining a pulse or heart rate associated with an end user of HMD 200 and a temperature sensor for determining a body temperature associated with the end user of HMD 200. In one embodiment, biometric sensor 220 includes a pulse rate measuring sensor which presses against the temple of the end user. Motion and orientation sensor 238 may include a three axis magnetometer, a three axis gyro, and/or a three axis accelerometer. In one embodiment, the motion and orientation sensor 238 may comprise an inertial measurement unit (IMU). The GPS receiver may determine a GPS location associated with HMD 200. Processing unit 236 may include one or more processors and a memory for storing computer readable instructions to be executed on the one or more processors. The memory may also store other types of data to be executed on the one or more processors.

In one embodiment, the eye tracking system 221 may include one or more inward facing cameras. The one or more inward facing cameras may capture images of an eye of an end user of the HMD. In another embodiment, the eye tracking system 221 may comprise an eye tracking illumination source and an associated eye tracking image sensor. In one embodiment, the eye tracking illumination source may include one or more infrared (IR) emitters such as an infrared light emitting diode (LED) or a laser (e.g. VCSEL) emitting about a predetermined IR wavelength or a range of wavelengths. In some embodiments, the eye tracking sensor may include an IR camera or an IR position sensitive detector (PSD) for tracking glint positions. More information about eye tracking systems can be found in U.S. Pat. No. 7,401,920, entitled "Head Mounted Eye Tracking and Display System", issued Jul. 22, 2008, and U.S. patent application Ser. No. 13/245,700, entitled "Integrated Eye Tracking and Display System," filed Sep. 26, 2011.

In one embodiment, the body facing camera 222 may include one or more downward facing cameras. The one or more downward facing cameras may capture images of a portion of a body of an end user of the HMD. For example, the one or more downward facing cameras may capture images of the end user's torso, chest, abdomen, or pelvic region. The images of the end user's body may be used to determine an orientation of the end user's body relative to the HMD. In one example, image processing techniques may be applied to the images of the end user's body to determine a direction that the end user's torso is facing relative to the HMD.

In one embodiment, eye glass 216 may comprise a see-through display, whereby images generated by processing unit 236 may be projected and/or displayed on the see-through display. The capture device 213 may be calibrated such that a field of view captured by the capture device 213 corresponds with the field of view as seen by an end user of HMD 200. The ear phones 230 may be used to output sounds associated with the projected images of virtual objects. In some embodiments, HMD 200 may include two or more front facing cameras (e.g., one on each temple) in order to obtain depth from stereo information associated with the field of view captured by the front facing cameras. The two or more front facing cameras may also comprise 3D, IR, and/or RGB cameras. Depth information may also be acquired from a single camera utilizing depth from motion techniques. For example, two images may be acquired from the single camera associated with two different points in space at different points in time. Parallax calculations may then be performed given position information regarding the two different points in space.

In some embodiments, HMD 200 may perform gaze detection for each eye of an end user's eyes using gaze detection elements and a three-dimensional coordinate system in relation to one or more human eye elements such as a cornea center, a center of eyeball rotation, or a pupil center. Gaze detection may be used to identify where the end user is focusing within a field of view. Examples of gaze detection elements may include glint generating illuminators and sensors for capturing data representing the generated glints. In some cases, the center of the cornea can be determined based on two glints using planar geometry. The center of the cornea links the pupil center and the center of rotation of the eyeball, which may be treated as a fixed location for determining an optical axis of the end user's eye at a certain gaze or viewing angle.

Figure 3:
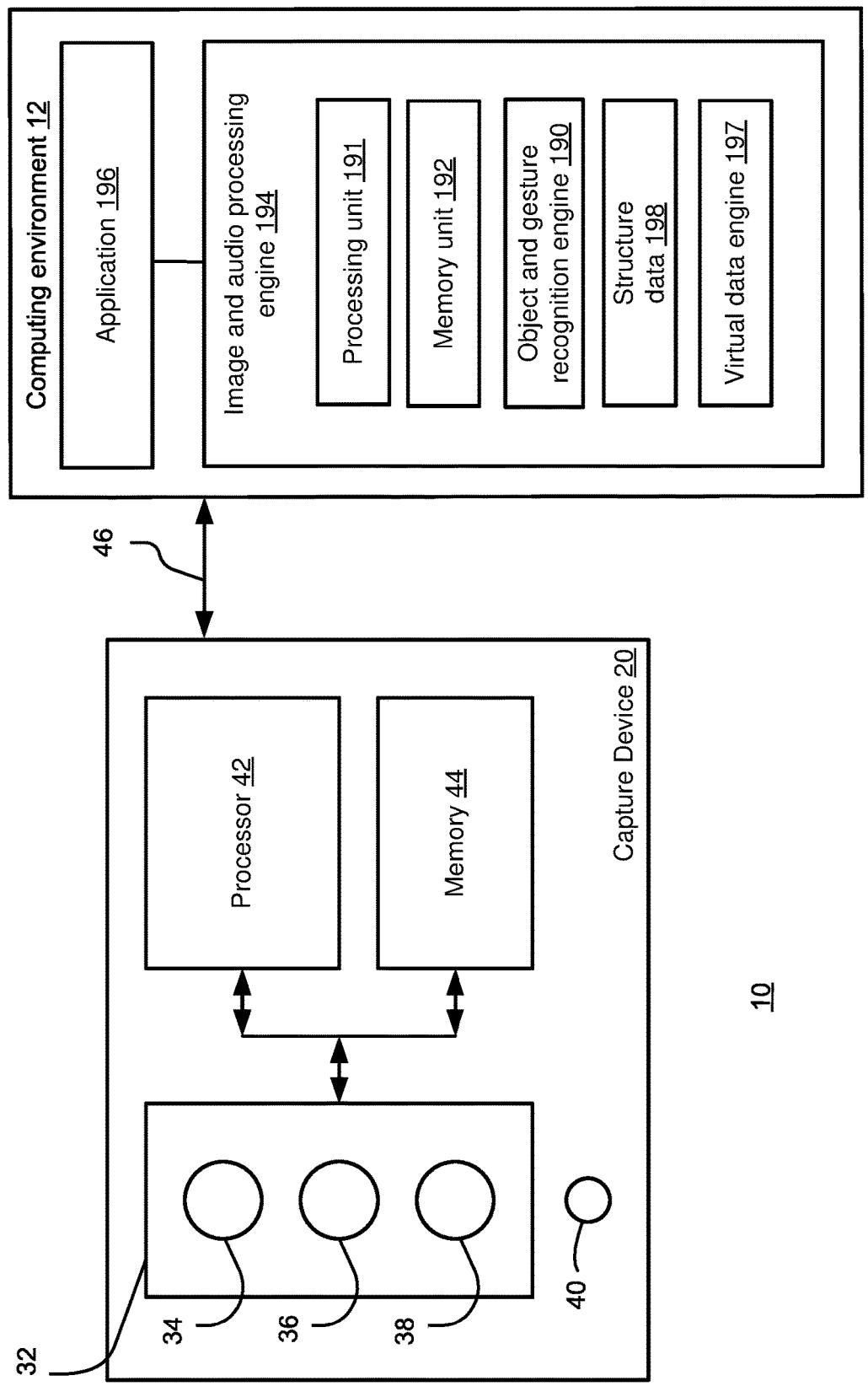
FIG. 3 depicts one embodiment of a computing system including a capture device and computing environment.

FIG. 3 depicts one embodiment of a computing system 10 including a capture device 20 and computing environment 12. In some embodiments, capture device 20 and computing environment 12 may be integrated within a single mobile computing device. The single integrated mobile computing device may comprise a mobile device, such as mobile device 19 in FIG. 1. In one example, the capture device 20 and computing environment 12 may be integrated within an HMD. In other embodiments, capture device 20 may be integrated with a first mobile device, such as mobile device 19 in FIG. 2A, and computing environment 12 may be integrated with a second mobile device in communication with the first mobile device, such as mobile device 5 in FIG. 2A.

In one embodiment, the capture device 20 may include one or more image sensors for capturing images and videos. An image sensor may comprise a CCD image sensor or a CMOS image sensor. In some embodiments, capture device 20 may include an image sensor and/or an IR CMOS image sensor. The capture device 20 may include an image camera component 32. The image camera component 32 may include an IR light component 34, a depth camera 36, and an RGB camera 38 that may be used to capture the depth image of a capture area. In one example, the IR light component 34 of the capture device 20 may emit an infrared light into the capture area and may then use sensors to detect the backscattered light from the surface of one or more objects in the capture area using the color and/or IR light sensing components within the image camera component 32. In some embodiments, pulsed infrared light may be used such that the time between an outgoing light pulse and a corresponding incoming light pulse may be measured and used to determine a physical distance from the capture device 20 to a particular location on the one or more objects in the capture area. Capture device 20 may also include optics for producing collimated light and/or for diffusing light (e.g., an optical diffuser for spreading light from an IR light source that generates a narrow beam of light) for illuminating an environment.

As depicted in FIG. 3, capture device 20 may include one or more microphones 40. Each of the one or more microphones 40 may include a transducer or sensor that may receive and convert sound into an electrical signal. The one or more microphones may comprise a microphone array in which the one or more microphones may be arranged in a predetermined layout.

The capture device 20 may include a processor 42 that may be in operative communication with the image camera component 32. The processor 42 may include a standardized processor, a specialized processor, a microprocessor, or the like. The processor 42 may execute instructions that may include instructions for receiving and analyzing images and/or determining whether a particular gesture has occurred (e.g., end user gestures for controlling or manipulating a virtual object). It is to be understood that at least some image analysis and/or gesture recognition operations may be executed by processors contained within one or more capture devices such as capture device 20.

The capture device 20 may include a memory 44 that may store the instructions that may be executed by the processor 42 and images (or frames of images) captured by the light sensing components of the image camera component 32. In one example, the memory 44 may include random access memory (RAM), read only memory (ROM), cache, Flash memory, a non-volatile memory, or any other suitable storage component. As depicted, the memory 44 may be a separate component in communication with the image capture component 32 and the processor 42. In another embodiment, the memory 44 may be integrated into the processor 42 and/or the image capture component 32. In other embodiments, some or all of the components 32, 34, 36, 38, 40, 42 and 44 of the capture device 20 may be housed in a single housing.

The capture device 20 may be in communication with the computing environment 12 via a communication link 46. The communication link 46 may be a wired connection or a wireless connection such as a wireless 802.11b, g, a, or n connection. In one embodiment, the capture device 20 may provide the images captured by, for example, the depth camera 36 and/or the RGB camera 38 to the computing environment 12 via the communication link 46.

As depicted in FIG. 3, computing environment 12 includes image and audio processing engine 194 in communication with application 196. Application 196 may comprise an operating system application or other computing application such as a gaming application, a messaging application, or an application for generating an augmented reality environment. Image and audio processing engine 194 includes virtual data engine 197, object and gesture recognition engine 190, structure data 198, processing unit 191, and memory unit 192, all in communication with each other. Image and audio processing engine 194 processes video, image, and audio data received from capture device 20. To assist in the detection and/or tracking of objects, image and audio processing engine 194 may utilize structure data 198 and object and gesture recognition engine 190.

Virtual data engine 197 processes virtual objects and registers the position and orientation of virtual objects in relation to various maps of a real-world environment stored in memory unit 192. The virtual data engine may also render images associated with virtual objects for display to an end user of computing system 10. In some embodiments, the computing system 10 may use images acquired from the capture device 20 to determine a six degree of freedom (6DOF) pose corresponding with the images relative to a 3D map of an environment. In one example, a 6DOF pose may comprise information associated with the position and orientation of a mobile device (e.g., an HMD) within the environment. The 6DOF pose may be used for localizing a mobile device and to generate images of virtual objects such that the virtual objects appear to exist at appropriate locations within an augmented reality environment. More information regarding determining a 6DOF pose can be found in U.S. patent application Ser. No. 13/152,220, "Distributed Asynchronous Localization and Mapping for Augmented Reality." More information regarding performing pose estimation and/or localization for a mobile device can be found in U.S. patent application Ser. No. 13/017,474, "Mobile Camera Localization Using Depth Maps."

Processing unit 191 may include one or more processors for executing object, facial, and voice recognition algorithms. In one embodiment, image and audio processing engine 194 may apply object recognition and facial recognition techniques to image or video data. For example, object recognition may be used to detect particular objects (e.g., a pencil held by an end user of an HMD) and facial recognition may be used to detect the face of a particular person within an environment. Image and audio processing engine 194 may apply audio and voice recognition techniques to audio data. For example, audio recognition may be used to detect a particular sound. The particular faces, voices, sounds, and objects to be detected may be stored in one or more memories contained in memory unit 192. Processing unit 191 may execute computer readable instructions stored in memory unit 192 in order to perform processes discussed herein.

The image and audio processing engine 194 may utilize structural data 198 while performing object recognition. Structure data 198 may include structural information about targets and/or objects to be tracked. For example, a skeletal model of a human may be stored to help recognize body parts (e.g., arms, hands, and/or fingers). In another example, structure data 198 may include structural information regarding one or more inanimate objects in order to help recognize the one or more inanimate objects (e.g., a pencil or stylus).

The image and audio processing engine 194 may also utilize object and gesture recognition engine 190 while performing gesture recognition. In one example, object and gesture recognition engine 190 may include a collection of gesture filters, each comprising information concerning a gesture that may be performed. The object and gesture recognition engine 190 may compare the data captured by capture device 20 to the gesture filters in a gesture library to identify when a user has performed one or more gestures. In one example, image and audio processing engine 194 may use the object and gesture recognition engine 190 to detect the performance of a particular gesture performed by an end user of the computing system 10 (e.g., an object selection gesture). In one embodiment, the object and gesture recognition engine 190 may utilize machine learning classification techniques.

FIGS. 4A-4C depict various embodiment of a portion of a see-through display, such as display 150 in FIG. 1.

FIGS. 4A, 4B and 4C depict front, top and side views, respectively, of an exemplary planar optical waveguide 400 that can be part of a waveguide assembly that is used to replicate an image associated with an input-pupil to an output-pupil. The term "input-pupil," as used herein, may refer to an aperture through which light corresponding to an image is overlaid on one or more input-couplers of one or more waveguides. The term "output-pupil," as used herein, may refer to an aperture through which light corresponding to an image exits one or more output-couplers of one or more waveguides. The planar optical waveguide 400 may be referred to as an optical waveguide 400, or even more succinctly as a waveguide 400. As will be discussed in further detail below with reference to FIG. 5, the image that the waveguide 400 is being used to replicate, and likely also expand, may be generated using a display engine that includes a light source assembly and an imaging device.

Referring to FIGS. 4A, 4B and 4C, the planar optical waveguide 400 includes a bulk-substrate 406 having an input-coupler 412 and an output-coupler 416. The input-coupler 412 is configured to couple light corresponding to an image associated with an input-pupil into the bulk-substrate 406 of the waveguide. The output-coupler 116 is configured to couple the light corresponding to the image associated with the input-pupil, which travels in the planar optical waveguide 400 from the input-coupler 412 to the output-coupler 416, out of the waveguide 400 so that the light is output and imaged from the output-pupil.

The bulk-substrate 406, which can be made of glass or optical plastic, but is not limited thereto, includes a first major planar surface 408 and a second major planar surface 410 opposite and parallel to the first major planar surface 408. The first major planar surface 408 can alternatively be referred to as the front-side major surface 408 (or more simply the front-side surface 408), and the second major planar surface 410 can alternatively be referred to as the back-side major surface 410 (or more simply the back-side surface 410). As the term "bulk" is used herein, a substrate may be considered to be "bulk" substrate where the thickness of the substrate (between its major surfaces) is at least ten times (i.e., 10×) the wavelength of the light for which the substrate is being used as an optical transmission medium. In one example, where the light (for which the substrate is being used as an optical transmission medium) is red light having a wavelength of 620 nm, the substrate will be considered a bulk-substrate where the thickness of the substrate (between its major surfaces) is at least 6200 nm, i.e., at least 6.2 µm. In accordance with certain embodiments, the bulk-substrate 406 has a thickness of at least 25 µm between its major planar surfaces 408 and 410. In specific embodiments, the bulk-substrate 406 has a thickness (between its major surfaces) within a range of 25 µm to 1000 µm. The bulk-substrate 406, and more generally the waveguide 400, is transparent, meaning that it allows light to pass through it so that a user can see through the waveguide 400 and observe objects on an opposite side of the waveguide 400 than the user's eye(s).

The planar optical waveguide 400 depicted in FIGS. 4A, 4B and 4C also includes an intermediate-component 414, which may alternatively be referred to as an intermediate-zone 414. Where the waveguide 400 includes the intermediate-component 414, the input-coupler 412 is configured to couple light into the waveguide 400 (and more specifically, into the bulk-substrate 406 of the waveguide 400) and in a direction of the intermediate-component 414. The intermediate-component 414 may be configured to redirect such light in a direction of the output-coupler 416. Further, the intermediate-component 414 may be configured to perform one of horizontal or vertical pupil expansion, and the output-coupler 416 may be configured to perform the other one of horizontal or vertical pupil expansion. For example, the intermediate-component 414 can be configured to perform horizontal pupil expansion, and the output-coupler 416 can be configured to vertical pupil expansion. Alternatively, if the intermediate-component 414 were repositioned, e.g., to be below the input-coupler 412 and to the left of the output-coupler 416 shown in FIG. 4A, then the intermediate-component 414 can be configured to perform vertical pupil expansion, and the output-coupler 416 can be configured to perform horizontal pupil expansion. The input-coupler 412, the intermediate-component 414 and the output-coupler 416 may be referred to collectively as optical components 412, 414 and 416 of the waveguide, or more succinctly as components 412, 414 and 416.

In some cases, a waveguide may include an input-coupler and an output-coupler, without including any intermediate-components. In such embodiments, the input-coupler would be configured to couple light into the waveguide and in a direction toward the output-coupler. In such embodiments, the output-coupler can provide one of horizontal or vertical pupil expansion, depending upon implementation.

In some embodiments, the input-coupler 412, the intermediate-component 414 and the output-coupler 416 can each be implemented as an optical grating, a diffraction grating, or as a diffractive optical element (DOE). A diffraction grating is an optical component that may contain a periodic structure that causes incident light to split and change direction due to an optical phenomenon known as diffraction. The splitting and angle may depend on the characteristics of the diffraction grating. When the periodic structure is on the surface of an optical component, it may be referred to as a surface grating. When the periodic structure is due to varying of the surface itself, it may be referred to as a surface relief grating (SRG). For example, an SRG can include uniform straight grooves in a surface of an optical component that are separated by uniform straight groove spacing regions. Groove spacing regions can be referred to as "lines," "grating lines," or "filling regions." The nature of the diffraction by an SRG depends on the wavelength, polarization and angle of light incident on the SRG and various optical characteristics of the SRG, such as refractive index, line spacing, groove depth, groove profile, groove fill ratio and groove slant angle.

In one embodiment, an SRG may be formed by applying a liquid monomer solution that includes a liquid monomer and nanoparticles to a surface of a substrate, pressing a mold that includes nanostructures on its surface into the liquid monomer to form gratings, and solidifying the liquid monomer (e.g., using heat or UV light) while the mold is held within the liquid monomer. The substrate may comprise a portion of a waveguide (e.g., a glass waveguide). In one example, the material composition of the liquid monomer may be designed using several liquid monomer compounds and suitable inorganic nanofillers which can be mixed to provide a uniform mixture. The mixture may then be coated on a waveguide substrate and later deformed to provide different material phases that create sub-layer or layers with different optical properties. In some cases, the phase separation can be conducted before the imprint process or during the pressing procedure.

Figure 5A:
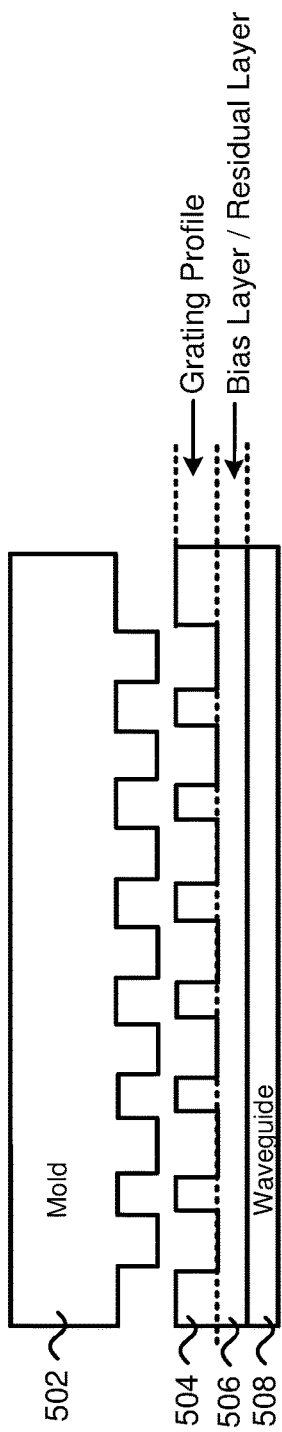
FIGS. 5A-5B depict portions of a fabrication process for forming an optical grating.
Figure 5B:
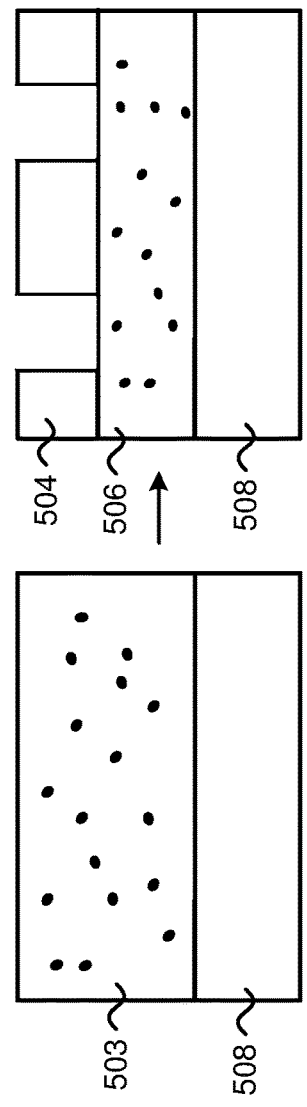

FIGS. 5A-5B depict portions of a fabrication process for forming an optical grating or an SRG. FIG. 5A depicts a mold 502 for creating an optical grating. The mold may comprise glass, silicon, or a transparent polymer. FIG. 5B depicts a liquid monomer layer 503 that includes nanoparticles uniformly distributed therein and that is arranged on the surface of a portion of a waveguide 508 (e.g., a glass waveguide). The mold 502 may be pressed into the liquid monomer layer 503 to form the optical grating in the grating profile layer 504. As depicted in FIG. 5B, the liquid monomer layer 503 has been separated into the grating profile layer 504 and the bias layer 506. The grating profile layer 504 includes the optical grating and does not include a threshold number of nanoparticles. The bias layer 506 is arranged between the grating profile layer 504 and the portion of the waveguide 508. In some cases, in order to achieve an optimal coupling function of the optical grating, the refractive index of the bias layer 506 may be matched to the refractive index of the waveguide 508.

Figure 5C:
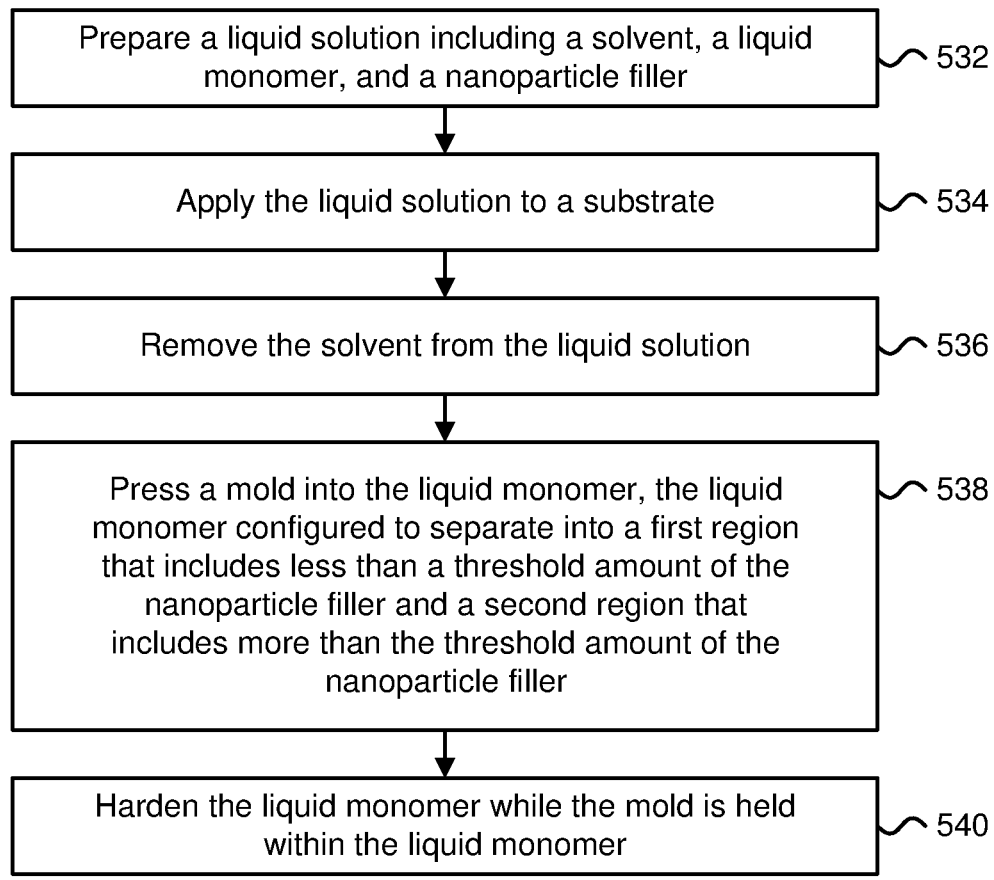
FIG. 5C is a flowchart describing one embodiment of a method for fabricating an optical grating.

FIG. 5C is a flowchart describing one embodiment of a method for fabricating an optical grating. In step 532, a liquid solution including a solvent, a liquid monomer, and a nanoparticle filler is prepared. The nanoparticle filler may comprise zirconium dioxide, silicon dioxide, and/or titanium dioxide nanoparticles. In step 534, the liquid solution is applied to a substrate. In step 536, the solvent is removed from the liquid solution. In one example, the solvent may be removed via application of heat to evaporate away the solvent. In step 538, a mold is pressed into the liquid monomer. The liquid monomer may be configured to separate into a first region that includes less than a threshold amount of the nanoparticles filler and a second region that includes more than the threshold amount of the nanoparticles filler. In step 540, the liquid monomer is hardened or solidified while the mold is held within the liquid monomer.

In some cases, the first region and the second region within the liquid monomer may be formed by pressing the mold into a first portion of the liquid monomer at a first rate and then pressing the mold into a second portion of the liquid monomer below the first portion at a second rate different from the first rate. The first rate may be greater than the second rate. In some cases, the first region and the second region within the liquid monomer may be formed by pressing the mold into a first portion of the liquid monomer without applying heat or UV light to the liquid monomer and then pressing the mold into a second portion of the liquid monomer below the first portion while applying heat or UV light to the liquid monomer. In some cases, the first region and the second region within the liquid monomer may be formed by pressing the mold into a first portion of the liquid monomer while the liquid monomer is set to a first temperature and then pressing the mold into a second portion of the liquid monomer below the first portion while the liquid monomer is set to a second temperature different from the first temperature. The second temperature may be greater than the first temperature. In some cases, the first region and the second region within the liquid monomer may be formed by pressing the mold into a first portion of the liquid monomer while the liquid monomer is exposed to UV light of a first light intensity and then pressing the mold into a second portion of the liquid monomer below the first portion while the liquid monomer is exposed to UV light of a second light intensity different from the first light intensity. The second light intensity may be greater than the first light intensity.

One embodiment of the disclosed technology includes applying a liquid solution to a surface of a substrate. The liquid solution comprises a solvent, a liquid monomer, and a nanoparticle filler that is evenly distributed within the liquid monomer. The method further comprises pressing a mold into the liquid monomer. The liquid monomer configured to separate into a first region that includes less than a threshold amount of the nanoparticle filler and a second region that includes more than the threshold amount of the nanoparticle filler during the pressing of the mold into the liquid monomer. The first region has a first refractive index and the second region has a second refractive index different from the first refractive index. The second refractive index matches a refractive index of the substrate. The method further comprises solidifying the liquid monomer while the mold is held within the liquid monomer.

One embodiment of the disclosed technology includes applying a liquid solution including a solvent, a liquid monomer, and a nanoparticle filler that is uniformly distributed within the liquid monomer to a surface of a waveguide and pressing a mold into the liquid monomer such that the liquid monomer separates into a first region that includes less than a threshold amount of the nanoparticle filler and a second region that includes more than the threshold amount of the nanoparticle filler. The first region has a first refractive index and the second region has a second refractive index different from the first refractive index. The second refractive index matches a refractive index of the waveguide. The method further comprises hardening the liquid monomer while the mold is held within the liquid monomer.

Figure 6:
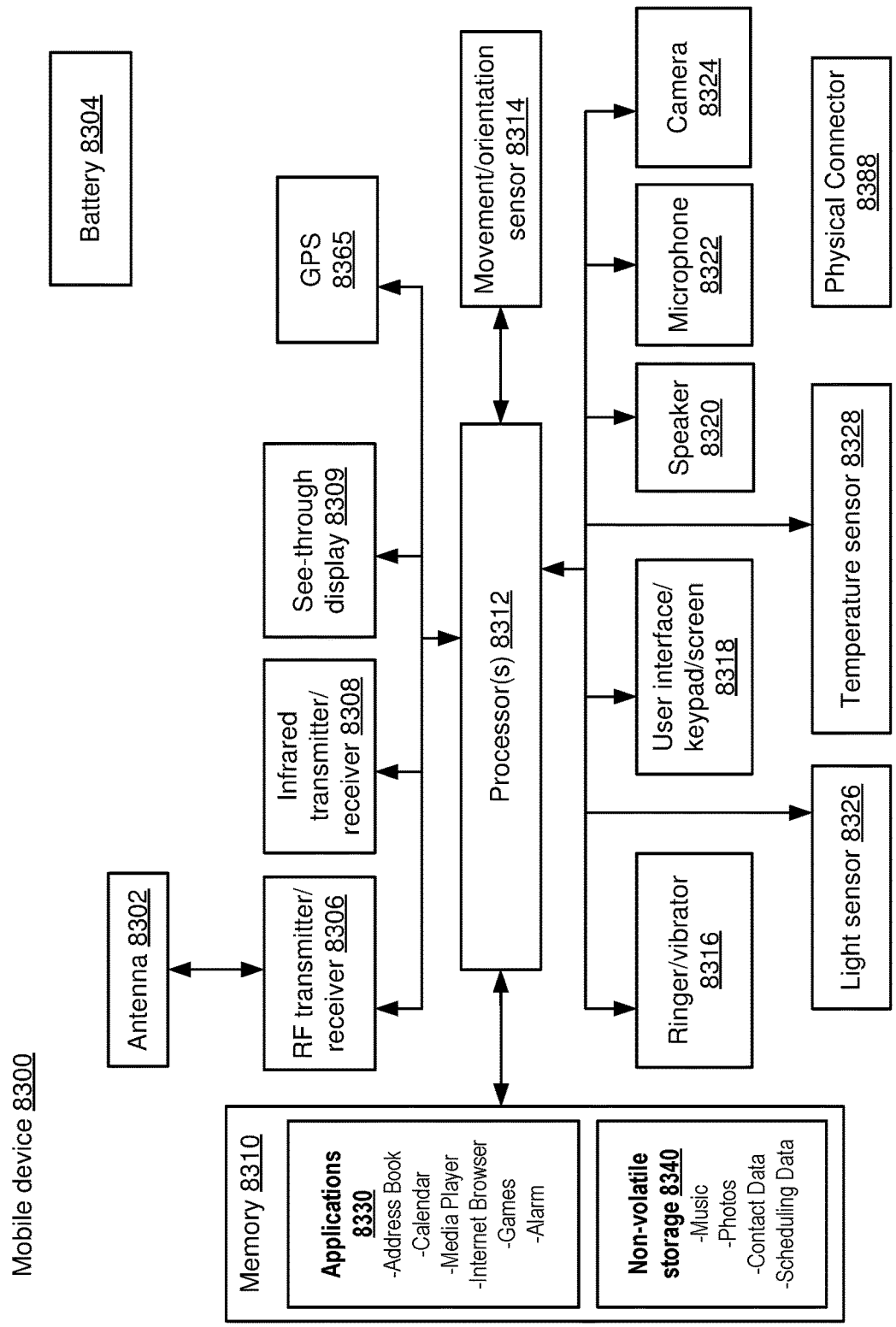
FIG. 6 is a block diagram of one embodiment of a mobile device.

FIG. 6 is a block diagram of one embodiment of a mobile device 8300, such as mobile device 19 in FIG. 1. Mobile devices may include laptop computers, pocket computers, mobile phones, HMDs, personal digital assistants, and handheld media devices that have been integrated with wireless receiver/transmitter technology.

Mobile device 8300 includes one or more processors 8312 and memory 8310. Memory 8310 includes applications 8330 and non-volatile storage 8340. Memory 8310 can be any variety of memory storage media types, including non-volatile and volatile memory. A mobile device operating system handles the different operations of the mobile device 8300 and may contain user interfaces for operations, such as placing and receiving phone calls, text messaging, checking voicemail, and the like. The applications 8330 can be any assortment of programs, such as a camera application for photos and/or videos, an address book, a calendar application, a media player, an internet browser, games, an alarm application, and other applications. The non-volatile storage component 8340 in memory 8310 may contain data such as music, photos, contact data, scheduling data, and other files.

The one or more processors 8312 are in communication with a see-through display 8309. The see-through display 8309 may display one or more virtual objects associated with a real-world environment. The one or more processors 8312 also communicates with RF transmitter/receiver 8306 which in turn is coupled to an antenna 8302, with infrared transmitter/receiver 8308, with global positioning service (GPS) receiver 8365, and with movement/orientation sensor 8314 which may include an accelerometer and/or magnetometer. RF transmitter/receiver 8308 may enable wireless communication via various wireless technology standards such as Bluetooth® or the IEEE 802.11 standards. Accelerometers have been incorporated into mobile devices to enable applications such as intelligent user interface applications that let users input commands through gestures, and orientation applications which can automatically change the display from portrait to landscape when the mobile device is rotated. An accelerometer can be provided, e.g., by a microelectromechanical system (MEMS) which is a tiny mechanical device (of micrometer dimensions) built onto a semiconductor chip. Acceleration direction, as well as orientation, vibration, and shock can be sensed. The one or more processors 8312 further communicate with a ringer/vibrator 8316, a user interface keypad/screen 8318, a speaker 8320, a microphone 8322, a camera 8324, a light sensor 8326, and a temperature sensor 8328. The user interface keypad/screen may include a touch-sensitive screen display.

The one or more processors 8312 controls transmission and reception of wireless signals. During a transmission mode, the one or more processors 8312 provide voice signals from microphone 8322, or other data signals, to the RF transmitter/receiver 8306. The transmitter/receiver 8306 transmits the signals through the antenna 8302. The ringer/vibrator 8316 is used to signal an incoming call, text message, calendar reminder, alarm clock reminder, or other notification to the user. During a receiving mode, the RF transmitter/receiver 8306 receives a voice signal or data signal from a remote station through the antenna 8302. A received voice signal is provided to the speaker 8320 while other received data signals are processed appropriately.

Additionally, a physical connector 8388 may be used to connect the mobile device 8300 to an external power source, such as an AC adapter or powered docking station, in order to recharge battery 8304. The physical connector 8388 may also be used as a data connection to an external computing device. The data connection allows for operations such as synchronizing mobile device data with the computing data on another device.

The disclosed technology is operational with numerous other general purpose or special purpose computing system environments or configurations. Examples of well-known computing systems, environments, and/or configurations that may be suitable for use with the technology include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The disclosed technology may be described in the general context of computer-executable instructions, such as program modules, being executed by a computer. Generally, software and program modules as described herein include routines, programs, objects, components, data structures, and other types of structures that perform particular tasks or implement particular abstract data types. Hardware or combinations of hardware and software may be substituted for software modules as described herein.

For purposes of this document, reference in the specification to "an embodiment," "one embodiment," "some embodiments," or "another embodiment" may be used to describe different embodiments and do not necessarily refer to the same embodiment.

For purposes of this document, the term "set" of objects refers to a "set" of one or more of the objects.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for fabricating an optical grating, comprising:
applying a liquid solution to a surface of a substrate, wherein the liquid solution comprises a solvent, a liquid monomer, and a nanoparticle filler that is evenly distributed within the liquid monomer;
pressing a mold into a first portion of the liquid monomer to form a first region that includes less than a threshold number of nanoparticles;
pressing the mold into a second portion of the liquid monomer below the first portion to form a second region that includes more than the threshold number of nanoparticles, wherein the first region has a first refractive index and the second region has a second refractive index different from the first refractive index, and wherein the second refractive index matches a refractive index of the substrate; and
solidifying the liquid monomer.

2. The method of claim 1, wherein:
the second refractive index is greater than the first refractive index.

3. The method of claim 1, wherein:
solidifying the liquid monomer includes applying UV light to the liquid monomer.

4. The method of claim 1, further comprising:
removing the solvent from the liquid solution prior to pressing the mold into the first portion of the liquid monomer.

5. The method of claim 4, wherein:
removing the solvent from the liquid solution prior to pressing the mold into the first portion of the liquid monomer includes baking away the solvent.

6. The method of claim 1, wherein:
applying the liquid solution to the surface of the substrate includes spin coating the liquid monomer solution onto the surface of the substrate.

7. The method of claim 1, wherein:
the nanoparticle filler includes titanium dioxide nanoparticles.

8. The method of claim 1, wherein:
pressing the mold into the first portion of the liquid monomer includes pressing the mold into the first portion of the liquid monomer at a first rate; and
pressing the mold into the second portion of the liquid monomer includes pressing the mold into the second portion of the liquid monomer at a second rate different from the first rate.

9. The method of claim 1, wherein:
pressing the mold into the first portion of the liquid monomer includes pressing the mold into the first portion of the liquid monomer while the liquid monomer is set to a first temperature; and
pressing the mold into the second portion of the liquid monomer includes pressing the mold into the second portion of the liquid monomer while the liquid monomer is set to a second temperature different from the first temperature.

10. The method of claim 1, wherein:
pressing the mold into the first portion of the liquid monomer includes pressing the mold into the first portion of the liquid monomer while the liquid monomer is exposed to UV light of a first light intensity; and
pressing the mold into second portion of the liquid monomer includes pressing the mold into the second portion of the liquid monomer while the liquid monomer is exposed to UV light of a second light intensity different from the first light intensity.

11. The method of claim 1, wherein:
the substrate comprises a portion of a glass waveguide used in a near eye display device.

12. One or more storage devices containing processor readable code for programming one or more processors to perform a method for fabricating an optical grating comprising the steps of:
- applying a liquid solution including a solvent, a liquid monomer, and a nanoparticle filler that is uniformly distributed within the liquid monomer to a surface of a waveguide;
- pressing a mold into a first portion of the liquid monomer to form a first region that includes less than a threshold number of nanoparticles;
- pressing the mold into a second portion of the liquid monomer below the first portion to form a second region that includes more than the threshold number of nanoparticles, wherein the first region has a first refractive index and the second region has a second refractive index different from the first refractive index, the second refractive index matches a refractive index of the waveguide; and
- hardening the liquid monomer.

13. The one or more storage devices of claim 12, wherein: the second refractive index is greater than the first refractive index.

14. The one or more storage devices of claim 12, wherein: hardening the liquid monomer includes applying UV light to the liquid monomer.

15. The one or more storage devices of claim 12, wherein: the nanoparticle filler includes titanium dioxide nanoparticles.

16. The one or more storage devices of claim 12, wherein:
- the pressing the mold into the first portion of the liquid monomer includes pressing the mold into the first portion of the liquid monomer at a first rate; and
- pressing the mold into second portion of the liquid monomer includes pressing the mold into the second portion of the liquid monomer at a second rate different from the first rate.

17. The one or more storage devices of claim 12, wherein:
- pressing the mold into the first portion of the liquid monomer includes pressing the mold into the first portion of the liquid monomer while the liquid monomer is set to a first temperature; and
- pressing the mold into the second portion of the liquid monomer includes pressing the mold into the second portion of the liquid monomer while the liquid monomer is set to a second temperature different from the first temperature.

18. The one or more storage devices of claim 12, wherein:
- pressing the mold into the first portion of the liquid monomer includes pressing the mold into the first portion of the liquid monomer while the liquid monomer is exposed to UV light of a first light intensity; and
- pressing the mold into the second portion of the liquid monomer includes pressing the mold into the second portion of the liquid monomer while the liquid monomer is exposed to UV light of a second light intensity different from the first light intensity.

19. A method for fabricating an optical grating, comprising:
- applying a liquid monomer and a nanoparticle filler that is uniformly distributed within the liquid monomer to a surface of a substrate;
- inserting a mold into a first portion of the liquid monomer to form a first region that includes less than a threshold number of nanoparticles;
- inserting the mold into a second portion of the liquid monomer below the first portion to form a second region that includes more than the threshold number of nanoparticles, wherein the first region has a first refractive index and the second region has a second refractive index greater than the first refractive index, and wherein the second refractive index is substantially the same as a refractive index of the substrate; and
- solidifying the liquid monomer.

20. The method of claim 19, wherein: the nanoparticle filler includes titanium dioxide nanoparticles.

* * * * *